(12) United States Patent
Davis et al.

(10) Patent No.: US 6,381,564 B1
(45) Date of Patent: Apr. 30, 2002

(54) METHOD AND SYSTEM FOR USING RESPONSE-SURFACE METHODOLOGIES TO DETERMINE OPTIMAL TUNING PARAMETERS FOR COMPLEX SIMULATORS

(75) Inventors: Joseph C. Davis, Allen; Karthik Vasanth; Sharad Saxena, both of Richardson; Purnendu K. Mozumder, Plano; Suraj Rao, Dallas, all of TX (US); Chenjing L. Fernando, Lyndhurst, OH (US); Richard G. Burch, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/304,189

(22) Filed: May 3, 1999

Related U.S. Application Data

(60) Provisional application No. 60/087,366, filed on May 28, 1998.

(51) Int. Cl.[7] .............................. G06F 9/45; G06F 9/455
(52) U.S. Cl. ............................... 703/22; 703/2; 703/13; 700/30; 700/31
(58) Field of Search ............................... 703/2, 13–16, 703/22; 700/28–31

(56) References Cited

U.S. PATENT DOCUMENTS

| | | | | |
|---|---|---|---|---|
| 5,438,527 A | * | 8/1995 | Feldmauer et al. | 716/19 |
| 5,655,110 A | * | 8/1997 | Krivokapic et al. | 703/13 |
| 5,781,430 A | * | 7/1998 | Tsai | 700/28 |
| 5,966,527 A | * | 10/1999 | Krivokapic et al. | 703/14 |
| 6,198,181 B1 | * | 3/2001 | Ali et al. | 310/42 |

OTHER PUBLICATIONS

Davis et al., J.C. Statistical Aspects of Tuning Simulators to Noisy Data, 3rd International Worjshop on Statistical Metrology, 1998, pp. 18–21.*

Boning et al., "DOE/Opt: A System for Design of Experiments, Response Surface Modeling, and Optimization Using Process and Device Simulation", IEEE Transactions on Semiconductor Manufacturing, vol. 7, Issue 2, pp. 233–244, May 1994.*

(List continued on next page.)

Primary Examiner—Russell W. Frejd
(74) Attorney, Agent, or Firm—Wade James Brady, III; Frederick J. Telecky, Jr.

(57) ABSTRACT

A method and system for providing optimal tuning for complex simulators. The method and system include initially building at least one RSM model having input and output terminals. Then there is provided a simulation-free optimization function by constructing an objective function from the outputs at the output terminals of the at least one RSM model and experimental data. The objective function is optimized in an optimizer and the optimized objective function is fed to the input terminal of the RSM. Building of at least one RSM model includes establishing a range for the simulation, running a simulation experiment for the designed experiment, extracting relevant data from said experiment and building the RSM model from the extracted relevant data. The step of running a simulation experiment comprises the step of running a DOE/Opt operation. The objective function is, for example, the square root of the sum of the squares at all of the differences between the target values and the observed values at all points being investigated. The optimizing in the optimizer is preferably a gain function which adjusts the parameters to the input based upon the error signal to minimize the error signal.

20 Claims, 1 Drawing Sheet

OTHER PUBLICATIONS

Fallon, et al., "Integration of Costing, Yield and Performance Metrics into the TCAD Environment Through the Combination of DOE and RSM", IEEE/USC/SEMI Inter. Symposium on Semiconductor Man., pp. 266–270, Sep. 1995.*

Fukuda, et al. "Application of TCAD to Designing Advanced DRAM and Logic Devices", SISPAD International Conference on Simulation of Semiconductor Processes and Devices, pp. 17–20, Sep. 1997.*

Le Carval et al., "Methodology for Predictive Calibration of TCAD Simulators", SISPAD International Conference on Simulation of Semiconductor Processes and Devices, pp. 177–180, Sep. 1997.*

Kleijnen, J. P. C., "Five–Stage Procedure for the Evaluation of Simulation Models Through Statistical Techniques", Proceedings Winter Simulation Conference 1996, pp. 248–254.*

* cited by examiner

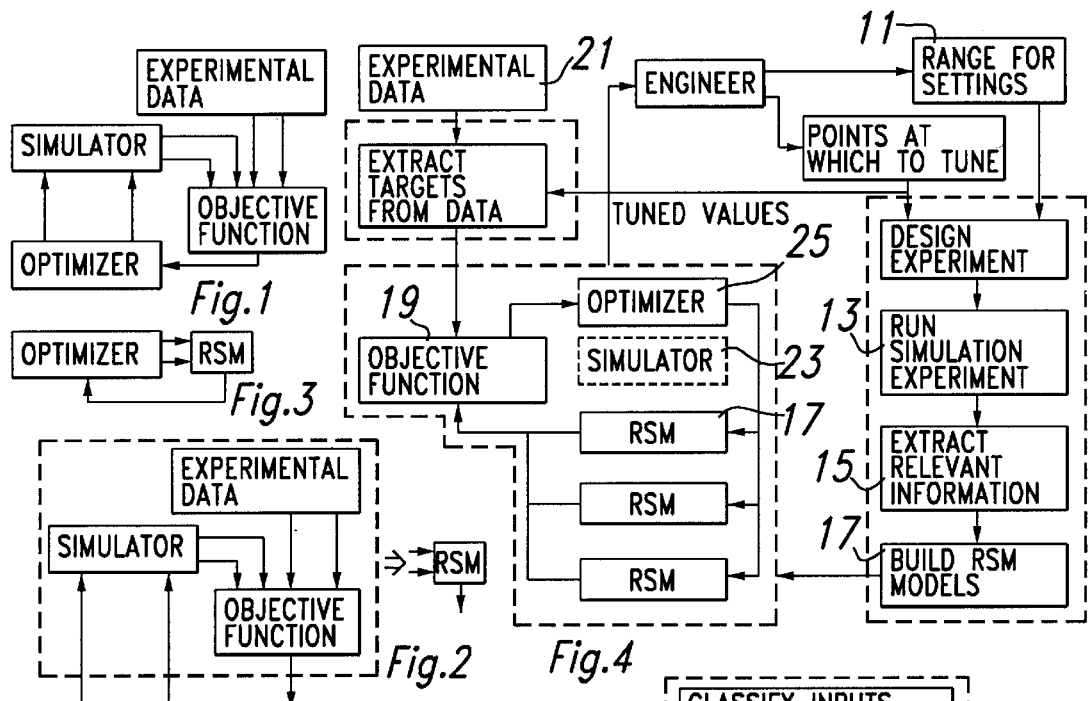
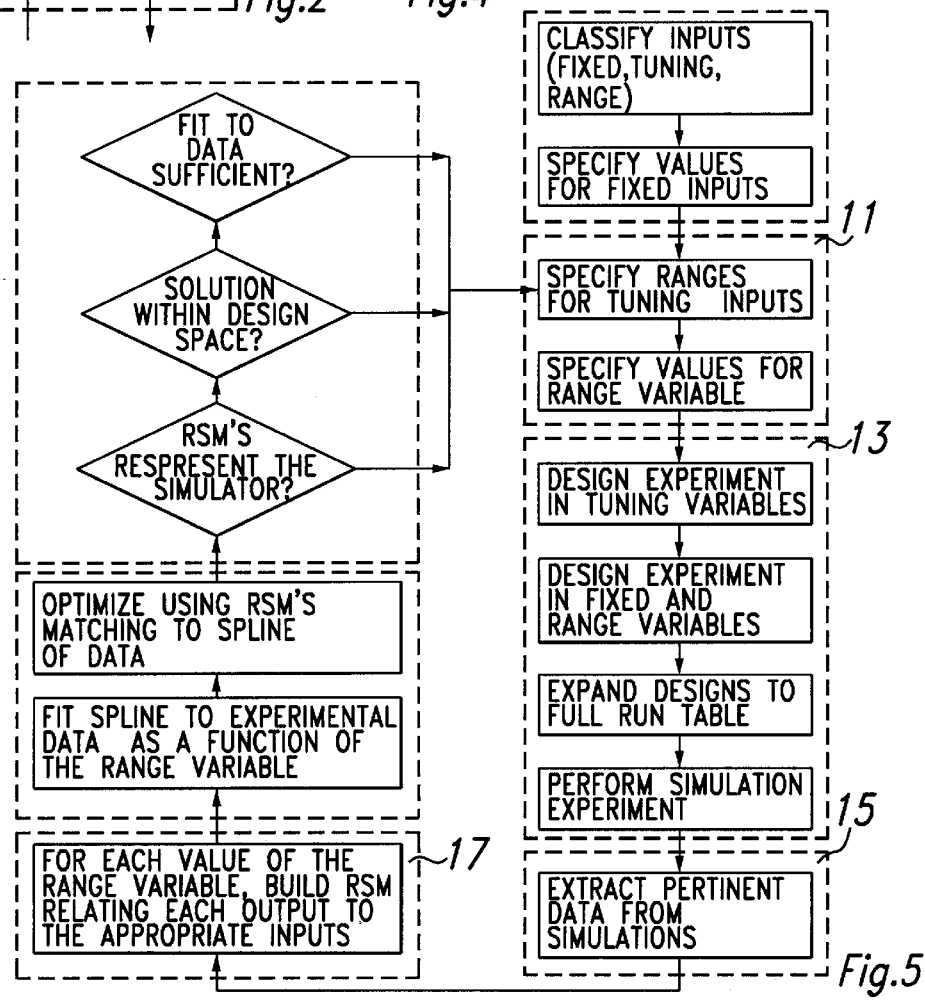

METHOD AND SYSTEM FOR USING RESPONSE-SURFACE METHODOLOGIES TO DETERMINE OPTIMAL TUNING PARAMETERS FOR COMPLEX SIMULATORS

This application claims priority under 35 USC 119(e)(1) of provisional application number 60/087,366 filed May 28, 1998.

BACKGROUND OF THE INVENTION

1. Field of the Invention

This invention relates to a method and system for providing optimal tuning for complex simulators.

2. Brief Description of the Prior Art

In the fabrication of semiconductor devices, there are many standard steps required to be performed to fabricate the completed device, such as, for example, doping, deposition, fabrication of the various metal and/or semiconductor layer and other steps. While the physical phenomena involved in many of these steps are well understood, this is not the case for all of the physical phenomena involved, some of the physical phenomena involved not being so well understood.

With the ever-increasing cost of manufacturing full-flow semiconductor devices, there is a great effort to reduce the number of semiconductor wafers used in developing new technologies, one such effort involving performance of process and device simulations to replace fabrication of the semiconductor wafers themselves. However, in order for this method to be useful, the simulations must accurately predict the actual results that would occur if the devices were to be manufactured and measured.

Furthermore, both the process and device simulators of the prior art have several deficiencies that result in poor predictive capability with the data being approximately 2.5 orders of magnitude below the simulation data, such results being clearly unacceptable for prediction purposes. As a result of this type of inaccuracy, simulation has been relegated to providing "trend" information that is used to aid in the design of experiments on real wafers instead of actually replacing fabrication of those wafers.

For this reason, complex simulators, such as semiconductor process and device simulators, often have to be "tuned" so that they can predict real-world data. The reasons for this are that many of the physical constants that the simulators use are not known exactly a priori and that the simulators often do not capture all of the physical phenomena involved. Tuning of these simulators requires determination of the correct values for the tunable parameters in the simulators such that the simulator can predict real-world data. Since each run of the simulator is expensive in terms of time and resources, the number of runs required to tune the simulators must be minimized. Additional problems arise from the presence of multiple objectives in the tuning (which gives rise to nonlinear objective functions). Known methodologies for tuning generally involve optimizing the tuning parameters by directly running the simulator (i.e., the simulator is in the optimization loop) The problems resulting from the prior art of the type described above are that the nonlinear objective functions lead to local minima, the expense of running simulations inhibits the use of global optimizers that can escape from local minima, advantage cannot be taken of job farming and multiple evaluations of the gradient are required (expensive for high dimensions).

"The most basic prior art system places the simulator in the loop along with the optimizer with the objective function being derived by operation on the output of the simulator and experimental data such as is shown in FIG. 1. There is shown typical prior art simulating circuitry which is a closed loop containing an objective function device 1, typically a summing amplifier, an optimizer 3 which is typically a gain stage and a simulators 5 which is an unknown circuit. The output of the simulator 5 and experimental data are both fed to the objective function device 1 which provides an error signal at its output, such as by sum squared difference or other appropriate well known procedure. This output is optimized by the optimizer 3, in well known manner, and fed to the simulator 5. The simulator 5 utilizes the output of the optimizer 3 in its circuit to provide the output which is fed to the object function device 1. The output of the simulator is altered by altering one or more of the parameters measured therein when there is an error until the error is zero. The simulations require a great deal of time. Problems with this prior art system are that the operation is serial in nature, requires an unknown number of simulations which affect speed and the quality of the solution depends upon the starting point with the system, on occasion, not finding a solution at all. It follows that the prior art system is not very thorough and it is apparent that a system which will provide the same result on a more rapid basis is highly desirable."

A further prior art system replaces both the simulator and the objective function with a response-surface model (RSM) and is shown in FIG. 2 with optimization taking place as shown in FIG. 3. This system is described in a paper of Gilles Le Carval et al. entitled *Methodology For Predictive Calibration of TCAD Simulators*, Proceedings of 1997 International Conference on Simulation of Semiconductor Processes and Devices (SISPAD), pp. 177–180 (1997), sponsored by IEEE, the contents of which are incorporated herein by reference, wherein there is a proposal to obtain a set of calibrated model parameters for predictive simulations. This methodology associates Design of Experiments (DOE) with Response Surface Method (RSM) and also advanced concepts of statistical analysis: D-optimal filtering and Taguchi's method. It has the characteristics of insensitivity to process conditions, optimal use of existing experimental results, rigorous statistical analysis of the data and clever selection of the model parameters. A problem with this system is that the method attempts to model the objective function (based upon those outputs and the experimental data) instead of modeling the functions themselves. In order to calculate the error signal, the square root of the sum of the squares of the target value (a low frequency signal) of each response minus the measured value must be calculated, this providing a very complex (high frequency) result. The prior art has attempted to model this complex result directly. It follow that when this complex result is compared with the experimental data received, which is much less complex (low frequency), a great deal of data is lost with the concomitant results of such data loss. By combining the simulator and data into the RSM, statistical analysis of tuning is not possible as can be demonstrated since, in general, the amount of noise in the coefficients can not be determined by the prior art and especially by the system and method described by Carvel et al.

SUMMARY OF THE INVENTION

In accordance with the present invention, the error is made to be the objective function of the RSM of the inputs rather than having the error signal being the RSM of the inputs or parameters as in the Le Carval method described above. Therefore, the RSMs, which replace the simulator, are the inputs that are received from the simulator, thereby retaining the high frequency behavior much more accurately and making the system more extensible in that, if the experimental data is now changed, such as tuning to another set of data over the same region of parameters, the experimental data need merely be replaced with subsequent recalculation. Furthermore, the RSMs in accordance with the present invention are independent of the experimental data whereas the prior art RSMs are dependent upon the experimental data. Therefore, the prior art must rebuild its models with any change in experimental data. Accordingly, the system in accordance with the present is more accurate than are prior art systems and independent of experimental data. In addition, the methodology in accordance with the present invention has broader applicability due to modeling the low frequency outputs of the simulator rather than the high frequency objective function.

Briefly, there is provided a general coherent methodology for tuning simulators to experimental data. With this methodology, excellent matches between simulated and experimental data are achieved to within one percent. The initial phase is to build an RSM model, this including de signing an experiment wherein there are provided the points at which to tune and the ranges for the parameter settings. A simulation experiment is then run and relevant information is extracted from the simulated experiment. The extracted information is used to build an RSM model or models. This RSM model. or models is now used in an optimization function without a simulator wherein experimental data is provided and targets are extracted from the experimental data. An objective function is provided as a function of the targets extracted from the data and the output(s) of the RSM(s) and provided to an optimizer which then updates the RSM(s).

To facilitate the use of this tuning technology, a software tool is provided that implements the methodology in an easy to use interface. This tool allows the user to specify a simulation block that controls the simulator and an extraction block that extracts relevant information from the simulations and the experimental data. The simulation and extraction blocks must, concurrently, be design of experiments (DOE)/Optimization (Opt) blocks of the type demonstrated by Duane S. Boning and P. K. Mozumder entitled DOE/Opt: A System For Design of Experiments, Response Surface Modeling, and Optimization Using Process and Device Simulation, *IEEE Transactions on Semiconductor Manufacturing*, 7(2):233–245, May, 1994. DOE/Opt is a simulation control interface that is used for running simulation experiments. This reference is incorporated herein by reference. Since design engineers already use DOE for running simulations, it is a simple step to make them work in conjunction with the above described tool in accordance with the present invention.

The tool, which is software as stated above, implements the tuning methodology in an easy to use interface. The tool uses engineer-specified DOE/Opt blocks to implement the simulations and extractions as shown in FIG. 1 and a set of routines to perform the modeling and optimization operations. For each new problem, the tool must be configured with the new simulation block, extraction block and variable definitions. Once this configuration is complete, the user can then interactively control the tuning process i.e., (which variables to tune with, which ranges to use, which outputs to use as targets, etc.). Additionally, the user is also given control of the tuning loop. For example, the complete tuning loop is the generation of the design, execution of the simulations, extraction of the data, modeling of the responses and optimization. Through interface options, the user can either command the tool to perform all of these tasks or any of the tasks individually.

The software tool is a TCL/TK program that runs, for example, under the UNIX environment and requires the presence of the DOE/Opt software as well as the Splus statistical analysis environment and is set forth in a reference of Richard A. Becker and John M. Chambers and Allan R. Wilks, *The New S Language: A Programming Environment for Data Analysis and Graphics*, Wadsworth & Brooks/Cole, 1988, the contents of which are incorporated herein by reference. The software tool performs the model building and optimization shown within the dotted lines in FIG. 4.

There are four classes of inputs used by the software tool. These inputs are (1) tuning variables, (2) fixed variables, (3) range variables and (4) control variables.

Tuning variables control the behavior of the simulator outputs over the range of the range variable and are the input variables that are used to tune the simulator to the experimental data. For example, in the Vt tuning example herein, the Vt roll-off behavior is exhibited over the range of gate lengths. The exact nature of this roll-off behavior is controlled by the tuning parameters. Thus, the tuning parameters are adjusted to match the roll-off behavior as a function of gate length. In order to avoid making assumptions about the nature of the simulator outputs as a function of the range variable, only specific values of the range variable are simulated and modeled. No attempt is made to produce models as a function of the range variable. When the simulator is tuned, a simulation experiment is designed and executed using these variables. Examples of tuning variables are Tox and Npoly in CV tuning and LDDchar and PocketChar in IV tuning. The most important information for tuning variables is the range over which these variables are to be tuned. These ranges are set by the engineer to reflect an initial guess at the value of each parameter. If tuning requires more than one iteration, then the engineer uses the results from one tuning iteration to update the ranges for subsequent iterations. At the end of each iteration, the toot updates the default value of the tuned variable with the new optimized value.

Fixed variables are those variables that are necessary for the execution of the simulation, but are not tuned. For example, the upper and lower sweep limits for the gate voltage in a capacitance-voltage simulation may be variables. However, these variables are fixed for any given tuning problem. Therefore, the tool places these variables in a separate table that can be accessed and then hidden. This capability makes the interface simple and easy to understand.

A range variable is the "x" variable over which the experimental data are varied. For example, when tuning a 1-D process simulator, the range variable is depth into the silicon. When tuning simulation parameters to match a CV curve, the range variable is the gate voltage. When tuning simulation parameters to match an IV curve, the range parameter can be gate length. There are two types of range variable, explicit and implicit. An explicit range variable is one which requires a separate simulation for each value that the variable takes on. For example, in the IV tuning example mentioned above, changing the gate length requires a new simulation. Thus, gate length is a n explicit range variable. An implicit range variable is one for which all values are simulated in a single run of the simulator. For example, in a CV simulation, all values of gate voltage are simulated (at discrete intervals) during one simulation. Therefore, if a number of gate voltages are specified for simulation, they are all performed together in a single simulation . A transformation for the range variable can also be specified during configuration of the tool. Since a separate response surface model (RSM) is generated for each value of range variable, this transformation does not affect the modeling of the simulator. However, the transformation can make visualization simpler. For example, in tuning simulation parameters across gate length, it is advantageous to plot 1/Lgate instead of Lgate due to the rapid change in device performance as gate length is reduced below 0.7 micrometers. Thus, if gate length is the range variable, the reciprocal transformation is specified.

If a variable has a different value in the simulation block and extraction block, then it is a control variable. This type of variable is often used to enable separate tasks within a single DOE block. Thus, the simulation and extraction blocks can be the same block with different functionality, depending on the value of the control variable. The tool allows a control variable to be specified with separate values for the simulation and extraction actions. The tool updates the value of the control variable, depending on the desired functionality before executing the block. In this manner, the engineer can write all of the desired functionality into a single DOE block.

In the prior art, no provision is made for the use of noisy data. However, if tuning is to "state of the art" processes, the data are often noisy and incomplete. Therefore, instead of tuning directly to the data, tuning is to the expected value of the data at the values of the range variable that the engineer specifies (for example, gate lengths of 0.16, 0.18 and 0.25 micrometers). The expected value is obtained by fitting a spline model (see Green and Silverman, *Non-parametric Regression and Generalized Linear Models*, Chapman and Hall, 1994, the contents of which are incorporated herein by reference) to each output as a function of the range variable. The spline is used because it does not make any assumptions about the behavior of the output as a function of the range variable, thus making the method very general. This model is then used to predict the expected value of the experimental data at the points specified by the engineer (which may not have been exactly present in the data). These predicted values are then used as the targets for optimization and the spline models are discarded. These values can be used to estimate the noise in the tuning parameters.

In accordance with the present invention, each response of the simulator is captured and response-surface models (RSMs) are then built relating these responses to the tuning parameters. An objective function is constructed from the outputs of the RSMs (sum of squared errors, etc.). Global optimization is performed over the tuning parameter space using the constructed objective function. Advantages of the invention are that the simulator is used only to build RSMs, thereby reducing the number of simulations and resulting in an absolute best answer within a given search space. There is also an indication if the best solution is outside of the given search space. The system in accordance with the present invention can be used to tune process simulators and to tune parameters for any complex simulator for which simulation time must be minimized.

Advantage provided in accordance with the present invention are (1) reduction in the number of simulations as compared with the prior art, (2) advantage is taken of job farming, (3) there is a thorough search of the tuning space, (4) the ability to tune to multiple data sets and (5) the ability to tune to multiple data sets allows performance of statistical analysis of the tuning procedure to estimate the uncertainty in the tuned parameter values.

It follows that a software tool has been provided that facilitates the execution of the tuning algorithm. The software implements the portions of FIG. 4 shown in dotted boxes with the remainder of the algorithm being the set up of the software and the evaluation of solutions by the engineer. Thus, the engineer is required in the loop.

BRIEF DESCRIPTION OF THE DRAWINGS

FIG. 1 is a block diagram of a typical prior art simulation system with the simulator in the loop;

FIG. 2 is a block diagram of a prior art simulation system wherein the simulator and objective function are replaced with a response surface model (RSM) of the type set forth by Le Carval;

FIG. 3 is a block diagram of prior art optimization with an RSM as set forth in Le Carval;

FIG. 4 is a diagram of a tuning algorithm for use in conjunction with the present invention; and FIG. 5 is a flow diagram for providing optimal tuning parameters in accordance with the present invention, it being assumed that DOE/Opt blocks have been defined in accordance with the prior art and that the software tool is configured for the problem through configuration, both as described herein.

DESCRIPTION OF THE PREFERRED EMBODIMENT

In accordance with the invention, simulations are conducted in the simulator according to the design of experiments (DOE) which is an arrangement of experiments in the design space such that the design space is explored with one simulation at each location in the space which is selected to provide a value at each point. A model (equations, i.e., polynomials, obtained by methods such as a regression analysis) which is the RSM is then fitted to that information to determine what happens at the selected point. This model or RSM now replaces the simulator of the prior art and provides good responses within the design space selected and therefore replaces the prior art simulator within the design space. However, since the model is easy to evaluate relative to the prior art simulator as described above, much more sophisticated types of optimization can be performed in the optimizer than was possible using the prior art and within a reasonable time frame.

A set of values is obtained from the simulator at each location in the design space (this set can be one or plural points). Thus, there is obtained a set of models over the design space-on a for each output. Additionally, there is a different set of models for each value of the range variable (e.g. 0.16, 0.18, 0.25) and four response variables (e.g. Vtsat, vtlsin Idsat, Ioff) in the example provided, this providing a total of 12 models. This is one of the advantages of the method, namely that the responses are modeled directly. Also important is the fact that the models are functions of the tuning parameters.

Referring to FIG. 4, there is shown a tuning algorithm for use in conjunction with the present invention. The simulator of the prior art (shown in phantom but not a part of the circuit) is approximated in limited range with response surface models (RSMs) with the RSM models used for optimization. Initially there is a modeling or model building stage wherein the ranges for the experiments are established 11 and a simulation experiment 13 is run which is running of a DOE/Opt block as discussed above and in the above cited Gilles et al. reference. For example, in a one at a time experiment, in a two dimensional space denoted as X1 and X2, X1 is set at some value and X2 is varied. X1 is then set at a different value in the two dimensional space and X2 is again varied with this procedure continuing for a predetermined number of locations in the two dimensional space with only the relevant information from these experiments being required to be extracted as relevant information 15. An RSM model or models 17 is/are built from the relevant information, this being, for example, a curve or equation which is fitted to the relevant information or data collected. The simulation step is now no longer utilized. In a factorial experiment, where each variable has a fixed number of levels that will be explored, the experiment consists of taking all possible combinations of those levels, depending upon the level of the model, taking some subset of the possible combinations. In accordance with the prior art as set forth in the above referenced article of Gilles Le Carval et al., the simulator in the loop of FIG. 1 is replaced by an RSM. The RSM of Le Carval et al. contains both the system and the objective function. This makes the system dependent upon the data and attempts to capture a high frequency phenomenon with a low frequency model. The problems inherent in this type of structure are discussed above. In accordance with the present invention, the objective function is not incorporated into the RSM.

The optimization function in accordance with the present invention is provided by initially constructing the objective function 19 from the outputs of the RSMs 17 that have been built initially and experimental data 21. The RSMs 17 are independent. The objective function is then constructed using the predictions set forth in the RSMs. The objective function 19 can be, for example, the square root of the sum of the squares at all of the differences between the target values and the observed values at all of the points being investigated. It should be noted that the simulator 23 is now no longer in the loop and is shown in FIG. 4 as not connected to anything within the optimization block. The output of the objective function 19 is then optimized in optimizer 25 which is a gain function which adjusts the parameters to the input based upon the error signal to minimize the error signal in well known manner.

Assume the objective is to determine two-dimensional doping profile parameters for the drain-extender implant, pocket implant, and transient enhanced diffusion (TED) model (see K. Vasanth et al., *An efficient method for modeling the effect of implant damage on nmos devices using effective profiles and device simulation*, Proceeding of the 1996 IEEE Electron Devices Meeting (IEDM), pages 717–720, Dec. 1996 and K. Vasanth et al., *A pocket model for 0.18 µm cmos devices process flows*, Proceedings of SISPAD, IEEE, 1997, the contents of which are incorporated herein by reference.) under the gate. These profiles control the Vt roll-off behavior of sub-micron NMOS devices. These profile parameters will then be used with a device simulator to predict device performance in the sub-micron regime for process conditions other than those used for tuning. The required data are experimental data as a function of gate length which include linear threshold voltage ($Vt_{lin}$), saturated threshold voltage ($Vt_{sat}$), saturated drain current ($Id_{sat}$) and off current ($I_{off}$) and the range of gate length must include gate lengths sufficiently short to exhibit strong Vt roll-off behavior that the model controls and process information which is implant conditions for all implants. This would be gate lengths of from about 0.16 to about 0.25µm for a 0.25µm technology. The parameters that may be tuned for this problem are as follows: (1) lateral parameter for pocket implant (PKTlat), (2) lateral parameter for drain-extender (MDD) implant (MDDlat), (3) magnitude of Gaussian used to define pile-up of boron at the surface/edge of NMOS device (1st Gaussian) (pilenP), (4) straggle of 1st Gaussian (pilen SP), (5) magnitude of the Gaussian used to define boron depletion for pile-up (2nd Gaussian) (depnP), (6) straggle of 2nd Gaussian (depnSP) and (7) lateral parameter for decay of TED model under the gate (pilelat).

The software tool, which is a collection of Tel/Tk and Splus code, requires a means for executing each simulation and extracting relevant information from those simulations. This is accomplished through the DOE/Opt program described by Duane S. Boning and P. K. Mozumder, Doe/opt: A system for design of experiments, response surface modeling, and optimization using process and device simulation, IEEE *Transactions on Semiconductor Manufacturing*, 7(2):233–245, May 1994, the contents of which are incorporated herein by reference. This program is a control interface for executing simulations. For this example, there are two DOE/Opt blocks, one for simulations and one for extracting data. The simulation DOE/Opt block must perform the following functions: (1) provide values for the variable that define the NMOS structure being simulated (profile parameters, geometries, etc.), (2) provide values for parameters to the simulator (material coefficients, options for models, etc.), (3) write the input deck for the device simulator and (4) execute the device simulator using the new input deck. Each of these simulations simulates the defined NMOS structure and produces predictions of the drain current (at discrete intervals) as a function of gate voltage for both linear and saturated operation. The extraction block extracts the $Vt_{lin}$, $Vt_{sat}$, $Id_{sat}$, and $I_{off}$ values from these simulated I–V curves for each simulation. The software must be configured for each new tuning problem. The steps in configuring the program are as follows: (1) start the software tool (tuner), (2) choose "configure new tuner" from main menu (this opens up the configuration window), (3) specify the name of the DOE/Opt block for simulation (software tool reads this file to determine the variable names, (4) specify the name of the DOE/Opt block for extraction, (5) specify the type for each simulation variable which may have the following type): (a) tuning (defined above), (b) fixed (all other variables that do not change), (c) control (none in this case), (d) range (gate length) where gate length is the range variable in this problem because that is the variable over which the responses will be tuned, (6) define type of range variable which, for this example is gate length which requires a change of structure with each different gate length requiring a different simulation, meaning that the range variable is explicit, (7) define range-variable transformation since, due to the dramatic roll-off of vt at short gate lengths, it is advantageous to plot the responses vs. 1/gate length, thereby requiring specification of the reciprocal of gate length, and (8) save the configuration to a file.

After a configuration has been saved, it can be loaded into the main interface of the software tool. Within the interface, the following must be defined before tuning can occur: (1) default values for tuning and fixed variables, (2) ranges (initial guesses) for all tuning variables, (3) specification which outputs are to be used in the tuning, (4) specification of file that contains the experimental data, and (5) providing values for the range variable (gate length). Values for the range variable may be specified either directly (numerically) in the main interface or through a graphical interface that shows the experimental data. For this example, gate lengths of 0.16 microns, 0.18 microns and 0.25 microns were chosen. These gate lengths correspond to target gate lengths in the experimental data and also cover the range over which the tuning variables described above are most influential. Once the values of the range variable have been specified, tuning can occur. The simplest manner of doing so is to choose the "Do Tuning" action from the Actions button. This selection initiates the full tuning loop, which consists of the following:

(1) Design an experiment to generate model in terms of the tuning variables.

Typically, this design is a Fractional Factorial design +Axial design to generate data for a quadratic model. However, the user can choose a lower-order model and, hence, a lower-order experiment (such as a linear model).

(2) Initialize simulation block with values for fixed variable.

(3) Pass design table (a summary of the design that describes the values that each input takes for each experiment. Each row contains all of the values for each input variable for a particular point in the design space.) to simulation block.

(4) Execute simulation block (executes all runs within the design table).

(5) Upon completion of all simulations, pass the design table to the extraction block.

(6) Execute the extraction block (executes all runs within the design table, filling in values for the desired outputs, e.g., $Vt_{sat}$, $Id_{sat}$, etc.).

(7) Execute modeling and optimization scripts which includes the steps of:

(a) fitting spline model (a non-parametric model of the data) which is well known in the statistics field and is described in the above-mentioned Green and Silverman reference to each response as a function of the range variable.

(b) using spline model to predict values of experimental data at the chosen values of the range variable. This approach allows the system to work when the experimental data has spread in the range variable and, thus there is no experimental data at exactly the desired value or when the data is noisy or incomplete. For instance, the value for gate length used in this example is the actual gate length and thus contains much error, especially at the short gate lengths of interest. There is no single device that has exactly a gate length of 0.16 microns. However, there are many that are very close. The spline model allows for determination of a good approximation using all of the data at hand while making few assumptions about the nature of the function over gate length.

(c) Build response surface models (RSMs) at each value of the range variable relating the tuning variables to a particular response at that value of the range variable. For this example, 12 models were built, one model for each response (4 responses) at each of the three values given for the range variable or, in other words, three gate lengths and four response variables. This part is key to the methodology as the responses are modeled individually and no relationship is assumed as a function of the range variable. This approach broadens the applicability of the method since no assumptions are made about the functionality over the range variable.

(d) Optimize to minimize $$\sum_{j=1}^{N} \sum_{i=1}^{M} \left( \frac{\hat{y}_{ij} - y_{t_{ij}}}{y_{t_{ij}}} \right)^2$$

where N is the number of responses, M is the number of values for the range variable, $y_{ij}$ is the RSM prediction for model response j and range value I and $y_{tij}$ is the target value for the same (derived from the spline model fit to the experimental data).

(e) Generate plots and reports, this involving a numeric report which contains RSM prediction at the optimal values of the tuning parameters, target values, the percent of mismatch between these two and the standard error (SE) of the RSM model and aplot of each response vs. range variable (experimental data) and simulation predictions at chosen values of gate length and the spline model fit to the experimental data.

(8) Evaluate tuning to determine if fit is satisfactory. In this step, the engineer studies the numeric and graphical reports generated by the Splus scripts. This evaluation involves determining if the match is sufficient (small mismatch) and whether or not the RSMs sufficiently fit the simulator data to warrant trusting the tuning results. A rule of thumb is that if the SE of the RSM is less than 0.2 times the target value, the models can be trusted.

(9) If the solution lies on the edge of the tuning space (either a maximum or a minimum of the range of one of the tuning variables), then the ranges should be moved in the direction in which the solution is projected.

(10) If the SE of the RSM models is too large (SE>0.2*target value), then the ranges of the tuning parameters must be reduced and the tuning re-rub.

(11) If the match to target is sufficient and the SE is small, then the tuning is complete.

Referring to FIG. 5, there is shown a flow diagram for providing optimal tuning parameters in accordance with the present invention. It is assumed that DOE/Opt blocks have been defined in accordance with the prior art as discussed hereinabove and that the software tool is configured for the problem through configuration as described previously. The functions as specified by character references correspond to the character references of FIG. 4.

Attached hereto is an unpublished 4 page paper entitled "STATISTICAL ASPECTS OF TUNING SIMULATORS TO NOISY DATA", of Joseph C. Davis et al., the contents of which are incorporated herein by reference.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of providing optimal tuning for complex simulators which comprises the steps of:

(a) providing a complex simulator;

(b) building in said simulator at least one response-surface model having input and output terminals; and (c) providing in said simulator a simulation-free optimization function by:

(i) constructing an objective function from the outputs at said output terminals of said at least one response surface model and experimental data;

(ii) optimizing the objective function; and
(iii) feeding the optimized objective function to said input terminal.

2. The method of claim 1 wherein said step of building at least one response-surface model includes the steps of establishing a range for the simulation; running a simulation experiment for the designed experiment; extracting relevant data from said experiment and building the response-surface model from the extracted relevant data.

3. The method of claim 2 wherein said step of running a simulation experiment comprises the step of running a DOE/Opt operation.

4. The method of claim 1 wherein said objective function is the square root of the sum of the squares at all of the differences between the target values and the observed values at all points being investigated.

5. The method of claim 2 wherein said objective function is the square root of the sum of the squares at all of the differences between the target values and the observed values at all points being investigated.

6. The method of claim 3 wherein said objective function is the square root of the sum of the squares at all of the differences between the target values and the observed values at all points being investigated.

7. The method of claim 1 wherein said step of optimizing comprises the step of providing a gain function which adjusts the parameters to the input based upon the error signal to minimize the error signal.

8. The method of claim 2 wherein said step of optimizing comprises the step of providing a gain function which adjusts the parameters to the input based upon the error signal to minimize the error signal.

9. The method of claim 3 wherein said step of optimizing comprises the step of providing a gain function which adjusts the parameters to the input based upon the error signal to minimize the error signal.

10. The method of claim 4 wherein said step of optimizing comprises the step of providing a gain function which adjusts the parameters to the input based upon the error signal to minimize the error signal.

11. The method of claim 5 wherein said step of optimizing comprises the step of providing a gain function which adjusts the parameters to the input based upon the error signal to minimize the error signal.

12. The method of claim 6 wherein said step of optimizing comprises the step of providing a gain function which adjusts the parameters to the input based upon the error signal to minimize the error signal.

13. A system for providing optimal tuning for complex simulators which comprises:
 (a) a complex simulator:
 (b) a simulation-free optimization function including:
  (i) a complex simulator:
  (ii) at least one response-surface model having an input terminal and an output terminal;
  (iii) an objective function device constructed from the outputs at said output terminals of said at least one response-surface model and experimental data; and
  (iv) an optimizer for optimizing the objective function, said optimized objective function being fed to said input terminal.

14. The system of claim 13 wherein said objective function is the square root of the sum of the squares at all of the differences between the target values and the observed values at all points being investigated.

15. The system of claim 13 wherein said optimizer comprises a gain function adjuster which adjusts the parameters to the input based upon the error signal to minimize the error signal.

16. The system of claim 14 wherein said optimizer comprises a gain function adjuster which adjusts the parameters to the input based upon the error signal to minimize the error signal.

17. A system for providing optimal tuning for complex simulators which comprises:
 (a) a complex simulator:
 (b) means for providing a simulation-free optimization function including:
  (i) a complex simulator;
  (ii) at least one response-surface model (RSM) having an input terminal and an output terminal;
  (iii) means for providing an objective function constructed from the outputs at said output terminals of said at least one response-surface (RSM) model and experimental data; and
  (iv) means for optimizing said objective function and feeding the optimized objective function to said input terminal of said response-surface model.

18. The system of claim 17 wherein said objective function is the square root of the sum of the squares at all of the differences between the target values and the observed values at all, points being investigated.

19. The system of claim 17 wherein said optimizer comprises a gain function adjuster which adjusts the parameters to the input based upon the error signal to minimize the error signal.

20. The system of claim 18 wherein said optimizer comprises a gain function adjuster which adjusts the parameters to the input based upon the error signal to minimize the error signal.

* * * * *